United States Patent [19]
Jin

[11] Patent Number: 6,041,268
[45] Date of Patent: Mar. 21, 2000

[54] METHOD FOR TRANSFORMING ORIGINAL BILL-OF-MATERIAL FOR PRINTED CIRCUIT BOARD INTO STANDARD BILL-OF-MATERIAL

[75] Inventor: Sang-Hun Jin, Daekukwangyok-Shi, Rep. of Korea

[73] Assignee: Daewoo Electronics Co., Ltd., Seoul, Rep. of Korea

[21] Appl. No.: 09/227,713

[22] Filed: Jan. 8, 1999

[30] Foreign Application Priority Data

Jun. 27, 1998 [KR] Rep. of Korea ............... 98-24596

[51] Int. Cl.⁷ .................................................. G06F 19/00
[52] U.S. Cl. ............................ 700/107; 700/106; 705/29
[58] Field of Search ........................... 705/29; 700/106, 700/107; 257/469

[56] References Cited

U.S. PATENT DOCUMENTS

| | | | |
|---|---|---|---|
| 4,459,663 | 7/1984 | Dye | 705/29 |
| 4,847,761 | 7/1989 | Ferriter et al. | 705/29 |
| 5,119,307 | 6/1992 | Blaha et al. | 364/468.14 |
| 5,197,001 | 3/1993 | Mukherjee | 705/29 |
| 5,307,261 | 4/1994 | Maki et al. | 705/29 |
| 5,796,614 | 8/1998 | Yamada | 364/468.13 |
| 5,838,965 | 11/1998 | Kavanagh et al. | 707/103 |

*Primary Examiner*—William Grant
*Assistant Examiner*—McDieunel M. Marc
*Attorney, Agent, or Firm*—Pillsbury Madison & Sutro LLP

[57] ABSTRACT

In a programmed computer system with a display device for preparing a working plan for inserting a plurality of materials into a printed circuit board, a method for transforming an original bill-of-material made by a material supplier into a standard bill-of-material is disclosed. In the method, the original bill-of-material is stored in a first storage area of the programmed computer system, and then field configuration information of the original bill-of-material is registered. Next, a bill-of-material transforming command is inputted, and then in response to the bill-of-material transforming command, material information of the original bill-of-material stored in the first storage area is transformed into the standard bill-of-material. Finally, the transformed material information is stored in a second storage area assigned as a standard bill-of-material area.

8 Claims, 15 Drawing Sheets

FIG. 8

PROCESS DIVISION SETUP — 264

| PCB NAME SETUP | PROCESS CODE SETUP | SKIP CODE SETUP |

266　　　268　　　270

SEARCH ITEM [CODE ▽]

NO. [0]

PCB NAME [    ]

DIVIDER [    ]

[ADD] [ERASE] [MODIFY]

START POSITION [1]

| NO. | PCB NAME | BOM RECOGNITION CODE |

[VERIFY] [CANCEL]

FIG. 9

BOM PROCESS DIVISION SETUP

| PCB NAME SETUP | PROCESS CODE SETUP | SKIP CODE SETUP |

268

SEARCH ITEM [CODE ▽]　　　START POSITION [5]

NO. [1]

EQUIPMENT NAME [JV]

PROCESS CODE [AXL]

BOM DIVIDER [JA]

[ADD]
[ERASE]
[MODIFY]

| NO. | EQUIPMENT NAME | PROCESS CODE | BOM RECOGNITOION CODE |
|---|---|---|---|
| 1 | JV | AXL | JA |
| 2 | ELT | AXL | JA |
| 3 | VCD | AXL | JA |
| 4 | M10 | ODD | JA |
| 5 | TDK | RDL | JA |
| 6 | RHU | ODD | JA |
| 7 | JV | MANUAL | JA |

[VERIFY] [CANCEL]

FIG. 10

| BOM PROCESS DIVISION SETUP | | |
|---|---|---|
| PCB NAME SETUP | PROCESS CODE SETUP | SKIP CODE SETUP |

270

MATERIAL CODE

9979800414

9979800414

ADD
ERASE
MODIFY

VERIFY
CANCEL

FIG. 11

MODEL REGISTRATION WINDOW

- MODEL NAME: KD1730
- KD1730
- PCB NAME: MAIN
- REGISTRATION TYPE: CAD DATA
- SUPPLIER: KDS
- CAD FILE: KD1730.pdf
- BOM FILE: 1730.bom

- UNION PCB: ○NO ○AUTO SEARCH ○MANUAL INPUT
- ARRAY PCB: ○NO ○AUTO SEARCH ○MANUAL INPUT
- EMPLOYED EQUIPMENT SETUP | ASS'Y CODE INPUT
- SEARCH KEY 1
- SEARCH KEY 2
- GENERATION DATE: 1998/01/07
- REMARKS

[REGISTER] [CANCEL]

FIG. 14

| MATERIAL No. | MATERIAL CODE | MATERIAL NAME | MATERIAL SPEC | PROCESS CODE |
|---|---|---|---|---|
| CW901 | 485923282S | CONN WAFER | 5267-07A STICK TYPE | ODD |
| C003 | CHIFDF472M | C CERA AC | HIKB AC400V 4700PF M | ODD |
| C007 | CCXB3D152K | C CERA | HIKB 2KV 1500PF K | ODD |
| C008 | CEXF2C220C | C ELECTRO | 160V RUS 22MF (10X20)TP | ODD |
| C101 | CCXB3A471K | C CERA | 1KV B 470PF K (T) | ODD |
| C108 | CCXB3A471K | C CERA | 1KV B 470PF K (T) | ODD |
| C115 | CEXF1E471C | C ELECTRO | 50V RUS 330MF 10*20 | ODD |
| C116 | CEXF1H331C | C ELECTRO | 50V RUS 330MF 10*20 | ODD |
| C123 | CCXB3A471K | C CERA | 1KV B 470PF K (T) | ODD |
| C221 | CEXF1C102C | C ELECTRO | 16V RUS 1000MF (10X20) TP | ODD |
| C308 | CEXD1H470F | C ELECTRO | 50V RND 47MF (10*20) TP | ODD |
| C411 | CEXF1H221C | C ELECTRO | 50V RUS 220MF (10X16) TP | ODD |
| C532 | CMXE2J472J | C MYLAR | PL 630V 4700PF J | ODD |
| C544 | CCXB3A471K | C CERA | 1KV B 470PF K (T) | ODD |
| C556 | CMXF2D104J | C MYLAR | MPP 200V 0.1MF J | ODD |

PREPARATION FINISHED BOM NUMBERS:685 NUM

FIG. 15

BOM ITEM INPUT

ADD
CANCEL

MATERIAL NUMBER — num
MATERIAL CODE — code
MATERIAL NAME — name
MATERIAL SPECIFICATION — spec
PROCESS CODE

FIG. 16

BOM ITEM INPUT — 332

- MATERIAL CODE: CODE
- MATERIAL NUMBER (REGISTERED)
- MATERIAL NUMBER (UNREGISTERED): NUM1, NUM2-10
- MATERIAL NAME: NAME
- MATERIAL SPECIFICATION: SPEC
- PROCESS CODE

ADD | CANCEL

METHOD FOR TRANSFORMING ORIGINAL BILL-OF-MATERIAL FOR PRINTED CIRCUIT BOARD INTO STANDARD BILL-OF-MATERIAL

BACKGROUND OF THE INVENTION

1. Field of the Invention

The present invention relates to a method for managing a work to automatically insert materials, electric and electronic components, into a printed circuit board (PCB) with a programmed computer system, and more particularly to a method for transforming a non-standardized original bill-of-material (BOM) into a standardized BOM which is adjusted to an environment of an assembly line for the PCB.

2. Description of the Prior Art

In work of automatically inserting electric and electronic materials into a PCB by using an automatic insertion machine, a working plan reflecting a particular environment of a PCB assembly line is necessary for high efficiency and reliability of the work.

When preparing the working plan, two important factors should be considered. The first factors is an environment for the automatic insertion machine. The automatic insertion machine is a machine for automatically inserting particular materials into the PCB by using position data on the PCB and insertion order of assigned materials. Characteristics of the automatic insertion machine such as a head size, a moving mechanism of a head, and the BOM to be provided vary according to manufacturers and models. For a correct and fast insertion, these various characteristics of the automatic insertion machine involved in an assembly line should be reflected upon preparing the insertion working plan for the PCB.

The second factor is an assembly environment relating to the BOM. The BOM should be prepared in a standard form so as to be suitable for a particular assembly environment. There are various kinds of materials which are inserted into the PCB, and even an identical kind of material may have different electric and physical characteristics. Besides, the materials to be inserted may arrange from a few ten to a few hundred per PCB, thus it is very important to intelligently plan the work that assigns the materials to respective insertion machines and determines insertion order. However, information on the BOM or a design drawing of the PCB provided from him or her who orders the insertion work is not standardized since it is hard for him or her to know the environment for the assembly line. Accordingly, for effective insertion work, a non-standardized BOM should be transformed into a standardized BOM which is suitable for the environment of the particular assembly line.

Meanwhile, some kinds of materials are not suitable for the automatic insertion with the automatic insertion machine, and these kinds of materials should be manually inserted into the PCB by workers. Accordingly, the amount of materials assigned to respective workers and a working map for these manual insertion materials should be reflected on preparation of the working plan. Besides, in view of a trend of small quantities and large species in manufacturing electric and electronic equipments, a PCB manufacturer is much needed to have capability of speedily and flexibly coping with various and frequent changes of PCB models.

SUMMARY OF THE INVENTION

An object of the present invention is to provide a method of standardizing a BOM which enables productivity of a PCB assembly line and reliability of an assembled PCB to increase by automatically transforming a different and non-standardized BOM into a standard BOM being suitable for a particular environment of an assembly line and by systemically and intelligently managing the BOM.

The method of the present invention is operable in a programmed computer system with a display device for preparing a working plan for inserting a plurality of materials into a PCB. To transform an original bill-of-material made by a material supplier into a standard bill-of-material, the method of the present invention comprises the steps of: storing the original bill-of-material in a first storage area of the programmed computer system; registering field configuration information of the original bill-of-material; inputting a bill-of-material transforming command; in response to the bill-of-material transforming command, transforming material information of the original bill-of-material stored in the first storage area into a standard bill-of-material; and storing the transformed material information in a second storage area assigned as a standard bill-of-material area.

Preferably, the method may further includes the steps of: displaying the bill-of-material editing window on the display device; selecting an edition button from the bill-of-material editing window; and in response to selection of the edition button, displaying an edition window for displaying the transformed standard bill-of-material.

BRIEF DESCRIPTION OF THE DRAWINGS

The above object and other advantages of the present invention will become more apparent by describing in detail preferred embodiments thereof with reference to the attached drawings, in which:

FIGS. 5 to 16 are screen states explaining a method for transformation of a BOM according to the embodiment of the present invention.

DETAILED DESCRIPTION OF THE INVENTION

Hereinafter, a preferred embodiment ot the present invention will be explained in more detail with reference to the accompanying drawings.

Figure 1:
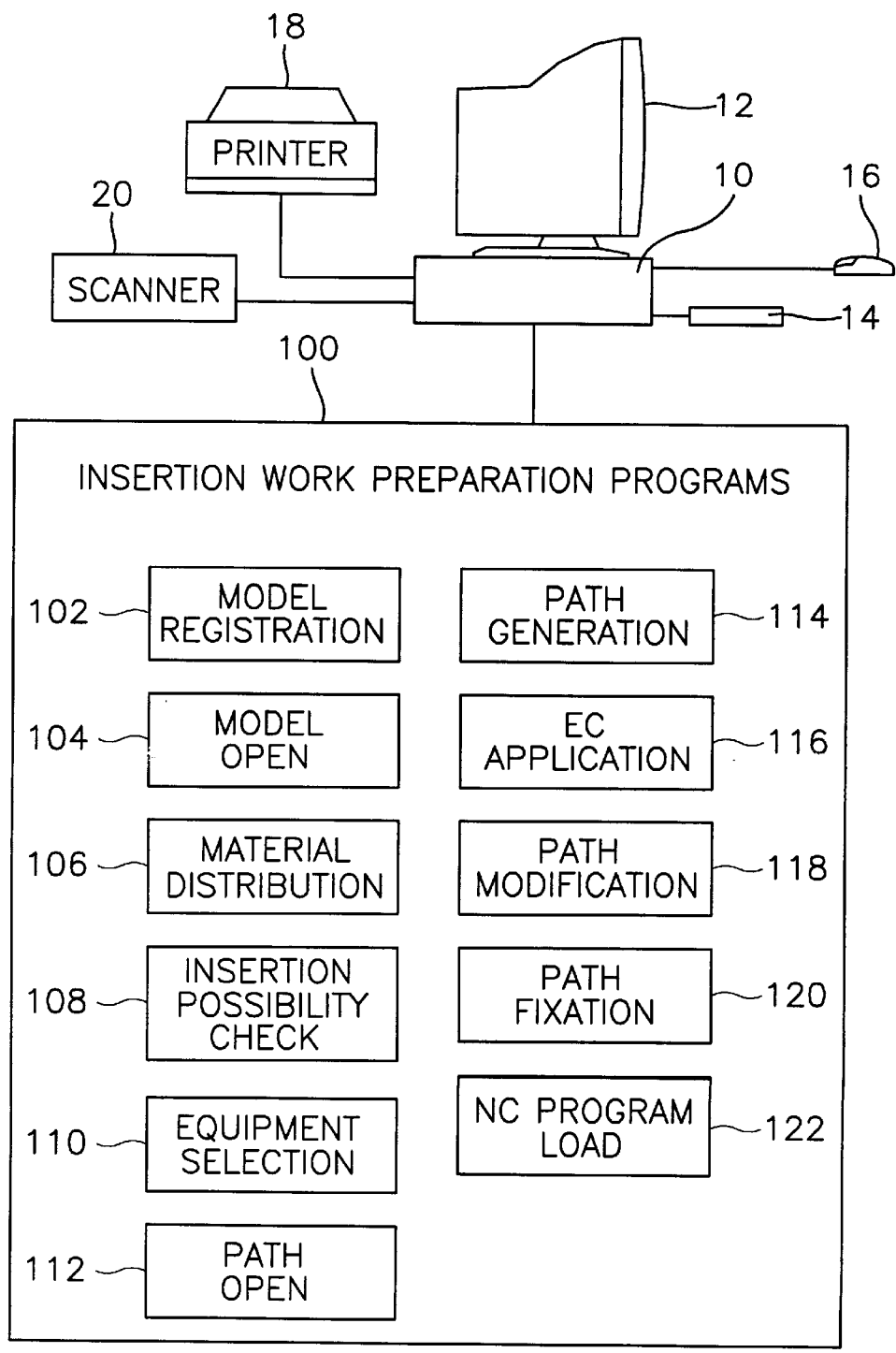
FIG. 1 illustrates a system configuration for preparing material insertion for a PCB according to an embodiment of the present invention.

FIG. 1 depicts a configuration of a computer system, programmed with several programs for preparing a material insertion work plan, with some input/output devices. The computer system has a main body 10 which includes a central processor unit (CPU), a random access memory, a read only memory, a hard disc, a floppy disc driver, and a graphic user interface, a monitor 12, a key board 14, a mouse 16, a printer 18, and a scanner 20, and each of which is connected to main body 10. A processor having higher performance than the 100 Mhz Pentium Processor of Intel Co., Ltd. could be recommended for the CPU, and at least 16 M or more could be recommended for the size of the random access memory.

The programs for preparation of a material insertion work according to the embodiment of the present invention, whose product name is "PATH OPTIMIZER", is resident in the hard disc. Windows 95 of MICROSOFT CO., Ltd. could be recommended as an operating system for the computer system, and Excell and Access programs of MICROSOFT Co., Ltd. could be recommended as auxiliary programs for the programs of the present invention.

The programs for the preparation of the material insertion work have several functional modules as follows: a model registration 102, a model open 104, a material distribution 106, an insertion possibility check 108, an equipment selection 110, a path open 112, a path generation 114, an engineering change application 116, a path modification 118, a path fixation 120, and a numerical control program load 122. The method for BOM transformation of the present invention relates to the functional module of model registration 102.

Figure 2:
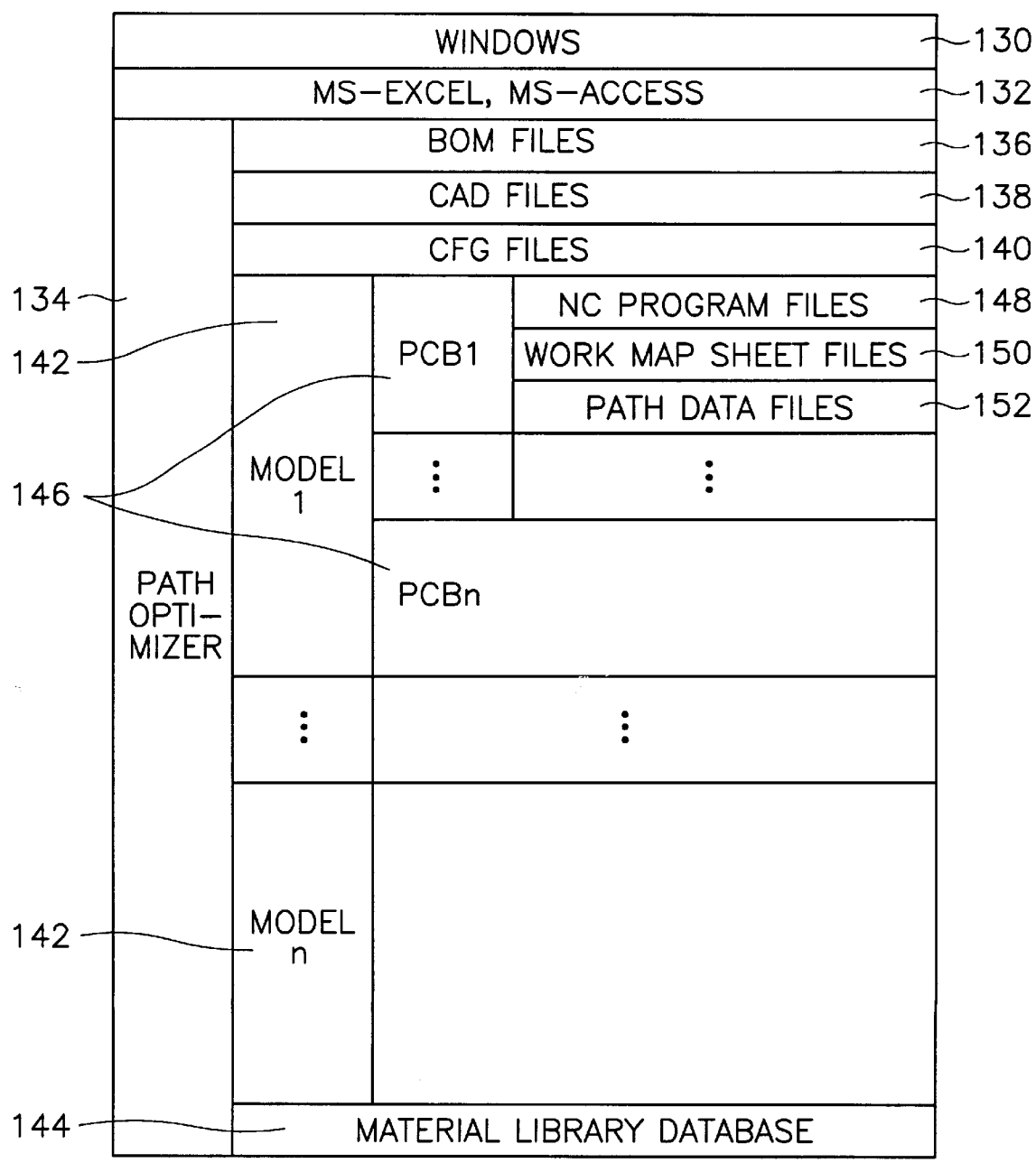
FIG. 2 shows constitution of a set of programs for preparing the material insertion work according to the embodiment of the present invention.

FIG. 2 illustrates a directory structure of the programs for the computer system of the present invention. Three basic directories are provided for a Windows 95 operating system 130, auxiliary programs 132, and programs for preparation of material insertion work 134. The programs for the preparation have BOM files 136, computer aided design (CAD) files 138, configuration files 140, multiple model files 142, and material library database files 144. Each model file 142 may have several subdirectories for multiple PCB files 146, and each of which is matched with a particular model. Each of PCB files 146 has numerical control program files 148, work map sheet files 150, and path data files 152. The method for BOM transformation of the present invention generates material files.

Figure 3:
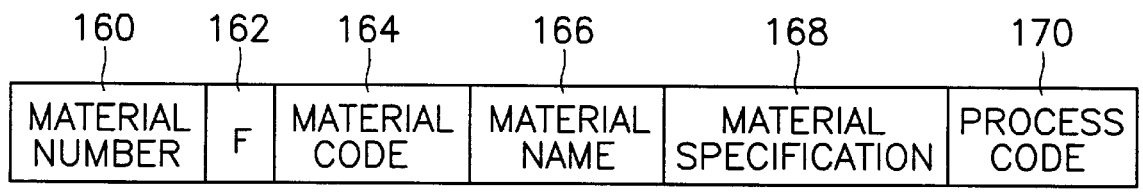
FIG. 3 shows a field configuration of a standard BOM according to the embodiment of the present invention.

FIG. 3 illustrates a basic field configuration, that is, a basic record structure, of a standard BOM. The basic record structure consists in order of a material number field 160, a material code field 164, a material name field 166, a material specification field 168, and a process code field 170. With being inserted between material number field 160 and material code field 164, a material registration flag field 162 may be an additional field of the basic record structure.

The transformation method of the BOM is described with reference to FIG. 4. Firstly, a start line and an end line are selected from an original BOM (S 180). The original BOM is read out line by line from the first line (S 182). Each field of the material number, the material code, the material name, and the material specification is retrieved from the read-out line (S 184). When multiple material numbers are supportable, the multiple material numbers are divided into respective material numbers (S 186). Records for all the divided material numbers are added to a database (S 188). Next, it is checked whether the end line is met (S 190). If an answer to the check is false then step S 182 is implemented. If not, the transformation is finished.

With reference to FIGS. 5 to 16, a preferred embodiment of the present invention is described.

Figure 5:
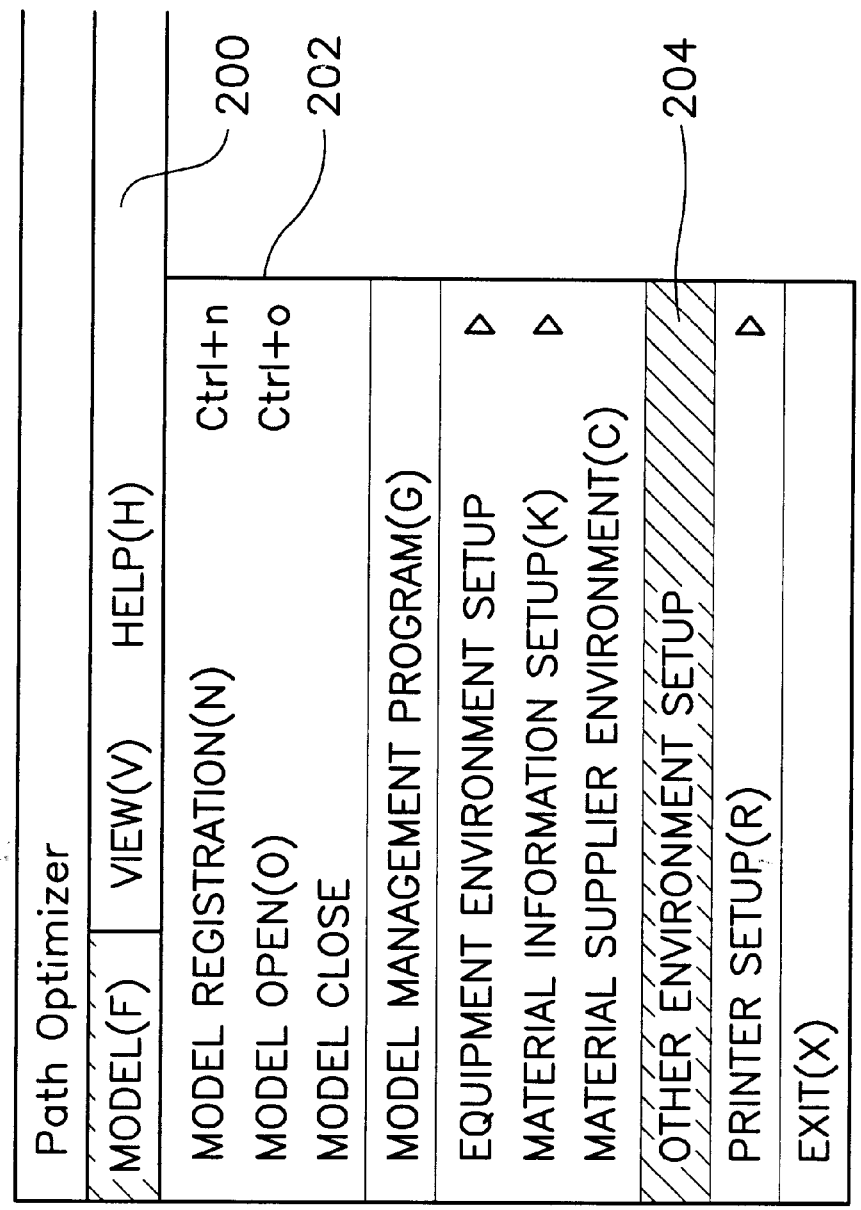

FIG. 5 is an initial screen of the program, PATH OPTIMIZER. If a user selects a "model" menu from a menu bar 200 by clicking a mouse 16, a pull-down menu box 202 appears. In advance of implementing a registration process for a new model, the following things are previewed: i) Things for the material supplier of a model to be newly registered, ii) Thing for a preparation state of CAD files and iii) Things for a preparation state of BOM files. When the model which is to be registered is an array PCB, it should be checked whether the CAD file is made only for a piece of PCB. The CAD files should be checked and should then be copied into a designated CAD directory. The BOM files should also be checked and should then be copied into a designated BOM directory.

Figure 6:
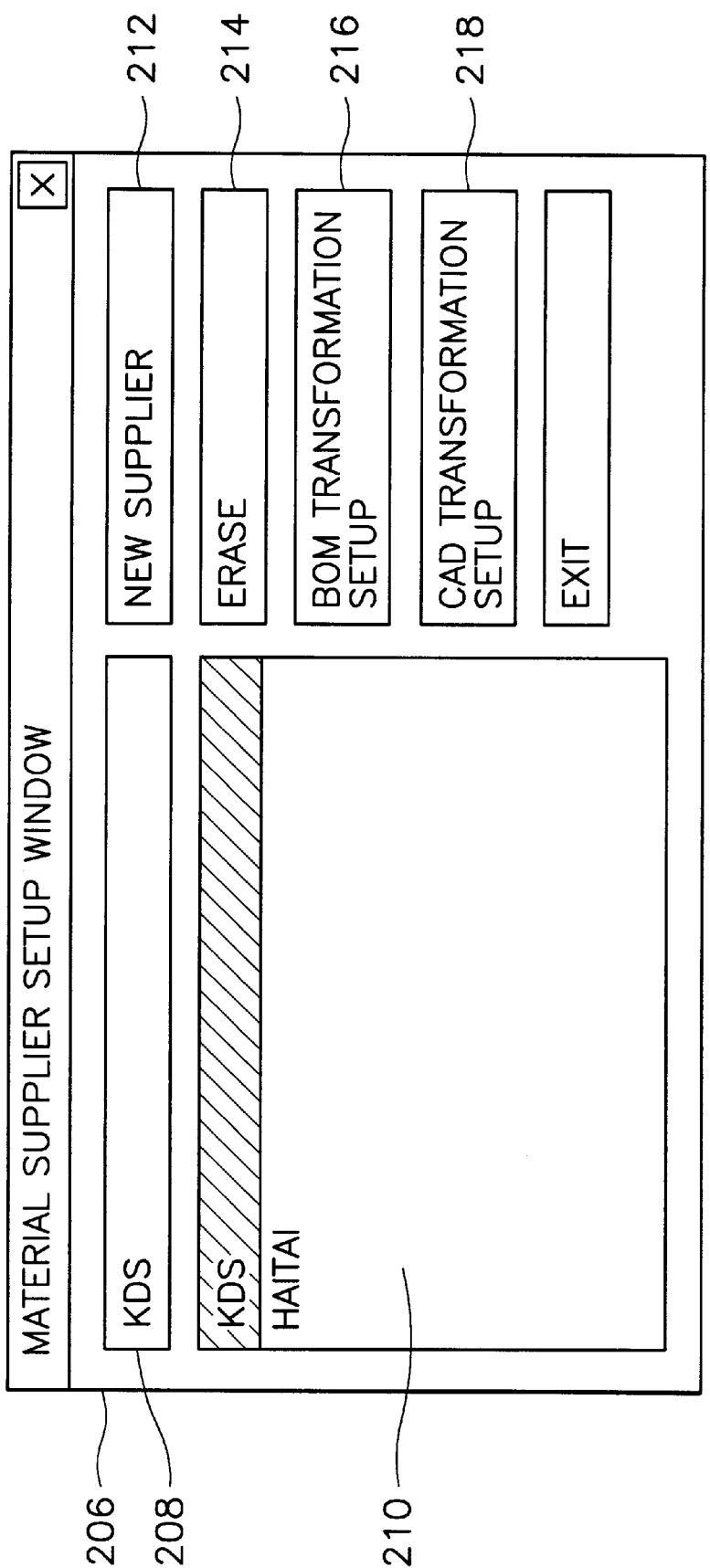

When a material supplier is a new one, in order to register the new material supplier, the user have to select a "material supplier environment setup" menu from pull-down menu box 202 of FIG. 5 by clicking. Then, a material supplier setup window 206 of FIG. 6 is displayed on the screen. If the user enters a new supplier's name through a text box 208 in the left-top of material supplier setup window 206 and then selects a "new supplier" button 212, the entered name appears in a list box 210 of material supplier setup window 206.

Figure 7:
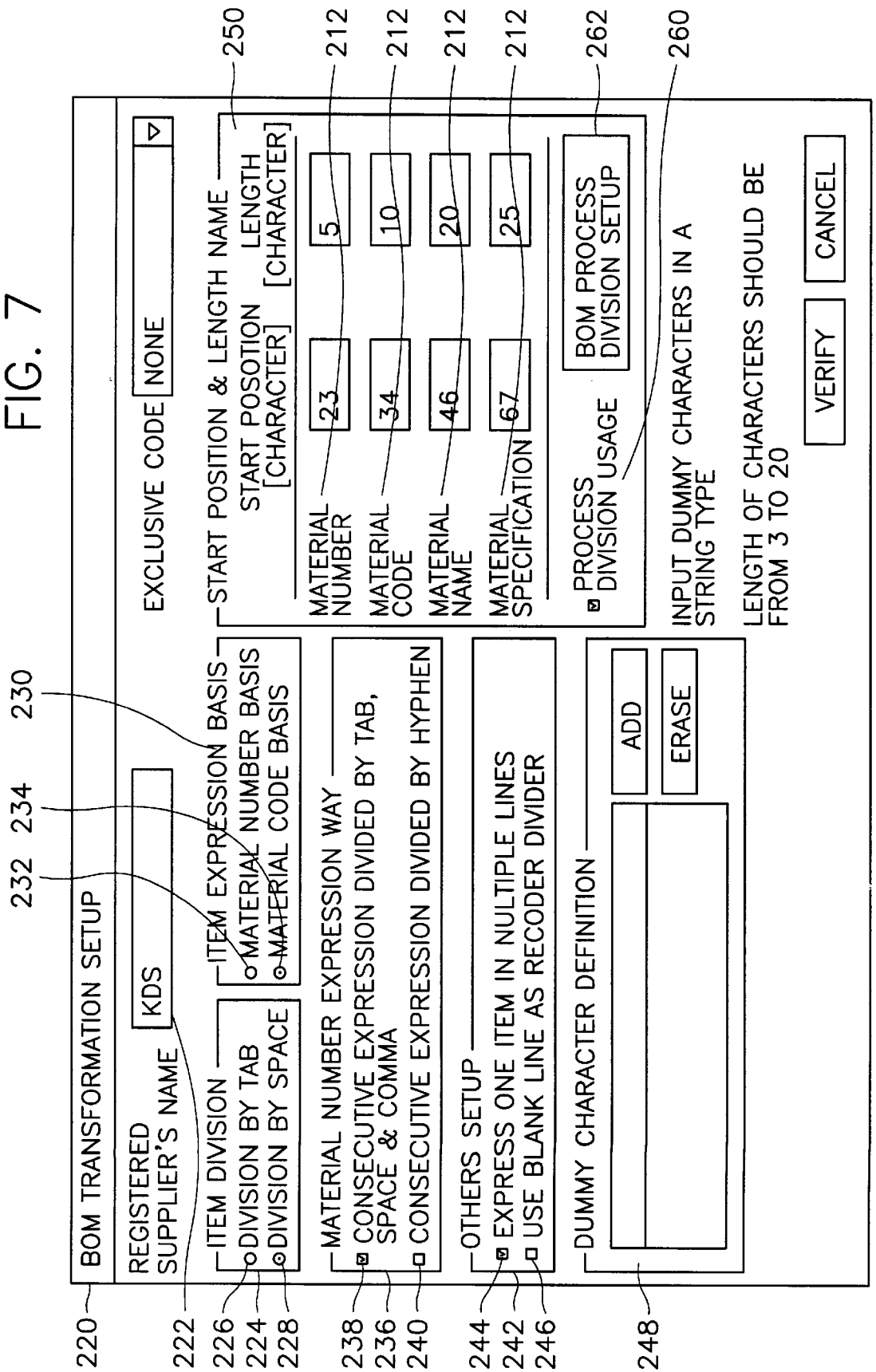
Figure 12:
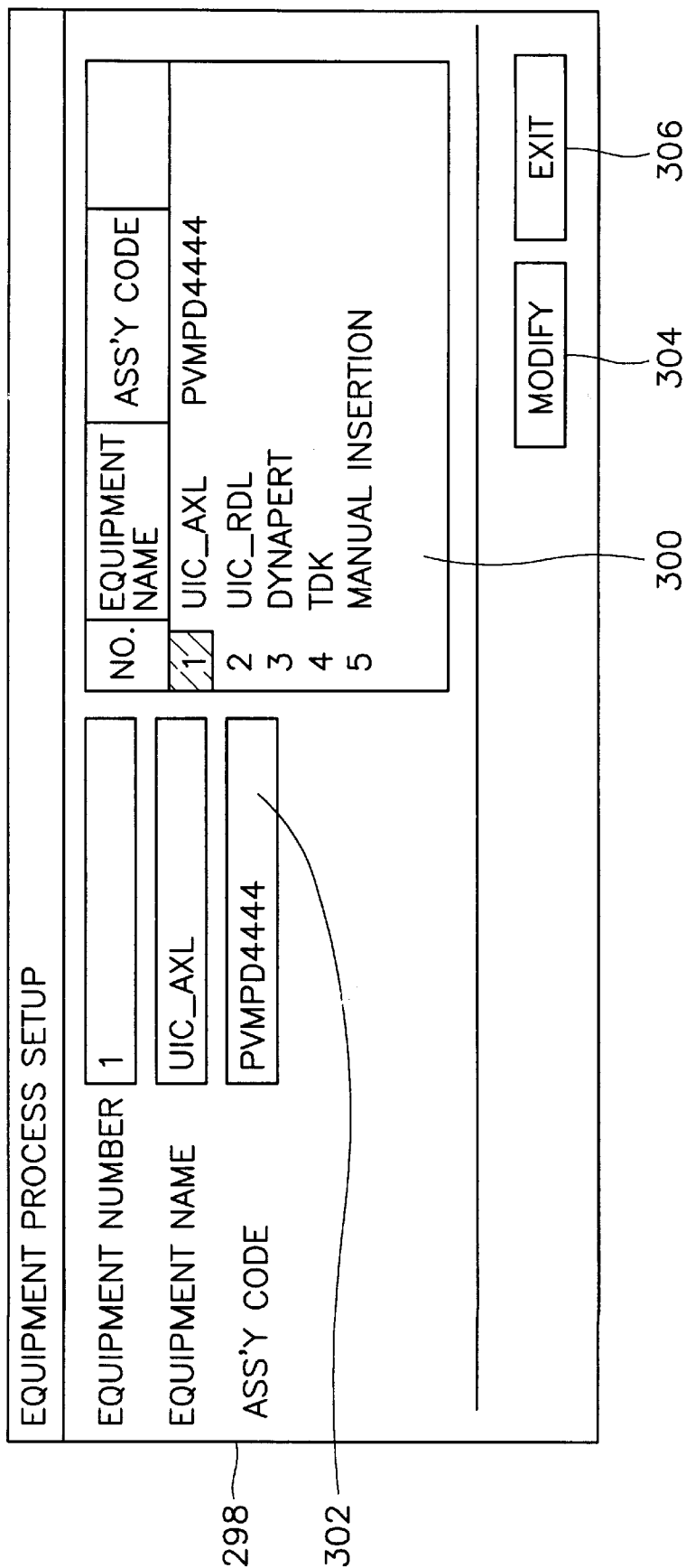

Besides, material supplier setup window 206 has "erase", "BOM transformation setup", and "CAD transformation setup" menus 214, 216, and 218. For implementing each of these menus, a particular material supplier has to be selected in advance. When "BOM transformation setup" menu 216 is selected, a BOM transformation setup window 220 is displayed on the screen as shown in FIG. 7. In BOM transformation setup window 220, a material supplier's name field 222, a field (that is, item) division box 224, a field expression basis box 230, a material number expression way box 236, an others setup box 242, a dummy character definition box 248, a field start point & length box 250, and verify and cancel buttons are arranged as shown in FIG. 7.

In material supplier's name field 222, the material supplier's name selected through the material supplier setup window 206 is displayed. A field division way of the original BOM can be selected through field division box 224. A division by a tab field 226 and a division by space field 228, where each field has a radio button, are provided within field division box 224 as a field division way. The former division is used to show that a start point of each field of the original BOM is designated by a tab key, in other words, every field of the original BOM is divided by the tab key. The latter division is used to show that the start point of each field of the original BOM is designated by a space key, in other words, every field of the original BOM is divided by the space key. Selection of the field division way can be done by selecting with a mouse pointer the radio button from the field division box 224.

Field expression basis box 230 is a menu for setting up on what basis the original BOM is made between a material number basis and a material code basis, and has two radio buttons paired with a material number basis field 232 and a material code basis field 234. Selecting the radio buttons can decide whether the material numbers relating to a code are expressed either as a whole or one by one paired with the code.

Material number expression way box 236 within the BOM transformation window contains a consecutive expression field by using a tab, space or comma divider 238 and a consecutive expression by using a hyphen divider 240, and each of which has a check box. Selection can be done by checking the check box with the mouse pointer. As illustrated in table 1, when the original BOM is made based on the material code, all the two expression ways have to be selected.

TABLE 1

| Example of Material Number Expression | Hyphen Division Consecutive Expression | Tab, Space or Comma Division Expression |
|---|---|---|
| R101,102,103 | — | V |

TABLE 1-continued

| Example of Material Number Expression | Hyphen Division Consecutive Expression | Tab, Space or Comma Division Expression |
|---|---|---|
| R101–103 | V | — |
| R101–103, R104,105,D112,D113 | V | V |

As another example, the material number can be divided by a space such as "R101 R102 R103".

Others setup box 242 contains a field for expressing an item in multiple lines 244 and a field for using a blank line as a record divider 246, and each of which has a check box. Each field can be selected by checking the check box with the mouse pointer.

An example of expressing an item with multiple lines is illustrated in table 2.

TABLE 2

| Code | Material Number | Specification | Cost |
|---|---|---|---|
| 10101010 | R101,R102,R103,R104,R105,R 106,R107,R108,R109,R110 | W1/2 8Ω | |

When material number data are expressed in multiple lines, the user should check the check box of expressing an item in multiple lines field 244. The user should also check the check box of using a blank line as a record divider field 246 when in the original BOM records are divided by the blank line for the purpose of differentiating a kind of material item from any other kinds of material items.

Dummy character definition box 248 is used to disregard characters that are not actual data of the original BOM. For example, because dummy characters such as "========" which are used as a box line has no relation with the actual data of the BOM, the dummy characters should be inputted in dummy character definition box 248 in advance for easy transformation of the BOM.

Field's start point and length box 250 has a material number field 252, a material code field 254, a material name field 256, and a material specification field 258, and each of which has a text box for inputting a start point data of respective field name and a length data counted from the start point, and a process division usage field 260. If a division by tab field 226 is selected in field division box 224 as the field division way, a field arrangement order is recognized as the start point data of each field and the length of each field is identical to character numbers of each field. If a division by space field 228 is selected as the field division way, the start point of each field is identical to an initial character's position of each field and the length of each field is identical to the character numbers of each field.

In process division usage field 260, a check box and a setup button are provided. To use a process division, the process division should be selected by checking the check box with the mouse pointer and then the menu of a BOM process division setup 262 should be selected. By these operations, a BOM process division setup window 264 appears on the screen as shown in FIG. 8. In BOM process division setup window 264, a PCB name setup tab 266, a process code setup tab 268, and a skip code setup tab 270 are provided.

PCB name setup tab 266 is used to extract necessary items for the PCB from the BOM. The user should set an item which contains a code for differentiation of the PCB as a check item, and should input a check code based on respective PCB names to which an initial position of a character to be compared is set. For the BOM process division, the user should input check codes for all kinds of PCBs where, for the successful registration of a model, the PCB name should be identical to the name inputted through the PCB name setup.

When assigning materials to respective equipment after extracting the necessary items of the PCB from the BOM, process code setup tab 268, as shown in FIG. 9, is used for equipment assignment based on the contents of the BOM by using a predefined process. As to the process name, several equipments can be assigned to one process name. The way to input is same as the way of PCB name setup.

Skip code setup tab 270 is used to disregard a particular material code among the extracted items from the BOM. The material code inputted through skip code setup tab 270 is disregarded.

After completion of setting up the process division usage, if the user closes process division usage setup window 264 illustrated in FIG. 8 and presses the verify button of BOM transformation setup window 220 of FIG. 7 with the mouse pointer, the BOM transformation setup operation is finished. If the user selects an "exit" button of material supplier setup window 206 in FIG. 6, the material supplier's environment setup operation is finished.

In the main menu screen of FIG. 5, if the user selects a model registration menu, a model registration window 272 of FIG. 11 is displayed on the screen.

Model registration window 272 contains a text box 274 for inputting a model name, a list box 276 for displaying pre-registered model lists, a text box 278 for inputting the PCB name, a text box 280 for inputting a registration type, a text box 282 for inputting the material supplier's name, a text box 284 for inputting a CAD file name, and a text box 286 for inputting a BOM file name. Model registration window 272 further contains a union PCB field box 288, an array PCB field box 290, an employed equipment setup button 292, an assembly code input button 294, and a search key field box 296.

Through model registration window 272, the model name and the PCB name can be inputted, and the material supplier, the CAD file and the BOM file can be selected. For the selection of the CAD and BOM files, the user should click " . . . " buttons arranged in the right side of CAD file field 284 and BOM file field 286 to have a chance for selecting a wanted file with searching contents of CAD and BOM directories.

When a model to be registered consists of several pieces of PCB, the items of the union PCB and the array PCB may be set as table 3.

TABLE 3

| Union PCB | Array PCB | Remark |
|---|---|---|
| No | No | When the model to be registered consists of one PCB |
| No | Auto Search/ Manual Input | When numbers of PCB pieces of a kind are several |
| Auto Search/ Manual Input | Auto Search/ Manual Input | When kinds of PCB pieces are several |

Employed equipment setup 292 is a menu for setting an equipment configuration of the model to newly be registered, and can be used, for example, when only three equipments are employed for material insertion work although five equipments are applicable or when several equipments are employed for an identical path in material insertion work. If the user selects equipment environment setup menu 292, the equipment environment setup menu of the model menu is selected.

To manage the model by using an assembly code, assembly code input button 294 needs to be clicked. Then, an equipment process setup window 298 is displayed on the monitor screen. An editing process of the assembly code is as follows. At first, if the user clicks one item in a list box 300 of equipment process setup window 298, then a set assembly code is displayed in a left text box 302. Next, the user inputs an assembly code and selects a modify button 304, which results in that the modified assembly code appears in list box 300. Finally, the user selects an exit button 306 to complete the edition.

As described above, in registration of the new material supplier, the existing field configuration information for the transformation of the BOM can be registered by selecting the material supplier.

In model registration window 272, selection of a model registration button 297 has a model registration process being initiated after inputting corresponding information in search key field box 296. Implementation of the model registration process has the BOM transformed in response to the field configuration information of the original BOM inputted upon setting up the material supplier described above.

Figure 4:
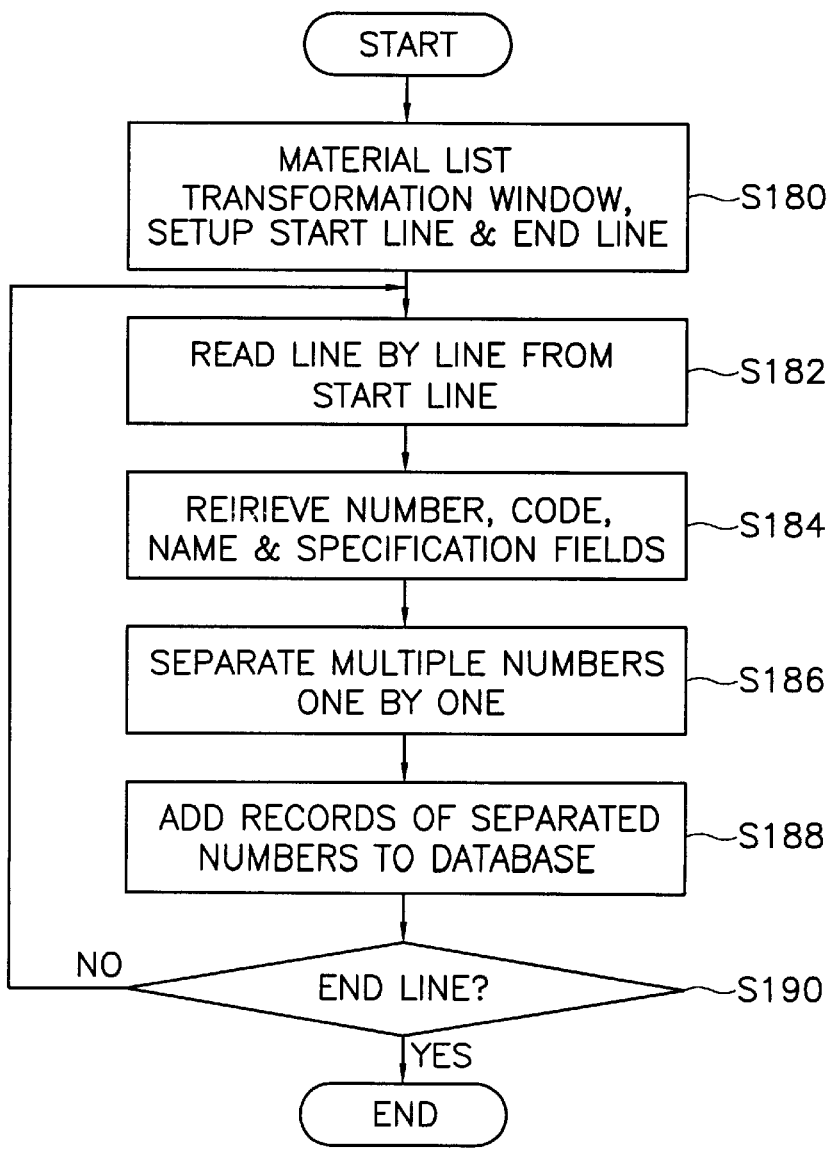
FIG. 4 illustrates a flow chart explaining a method for transformation of a BOM according to the embodiments of the present invention.

As illustrated in FIG. 4 and described above, the transformation of the BOM is achieved in response to the model registration. In detail, a start line and an end line of the copied original BOM to be transformed are selected. The selected records are read out line by line from the start line. The material number, the material code, the material name, and the material specification field are retrieved from the read line based on the field division information registered when setting up the material supplier's name. When multiple material numbers are supportable, the multiple material numbers are divided into a respective material number in response to the information of a material number expression way. Records for all the divided material numbers are added to a database. After checking whether the end line is met, the transformation operation is finished when the end line is met.

Figure 13:
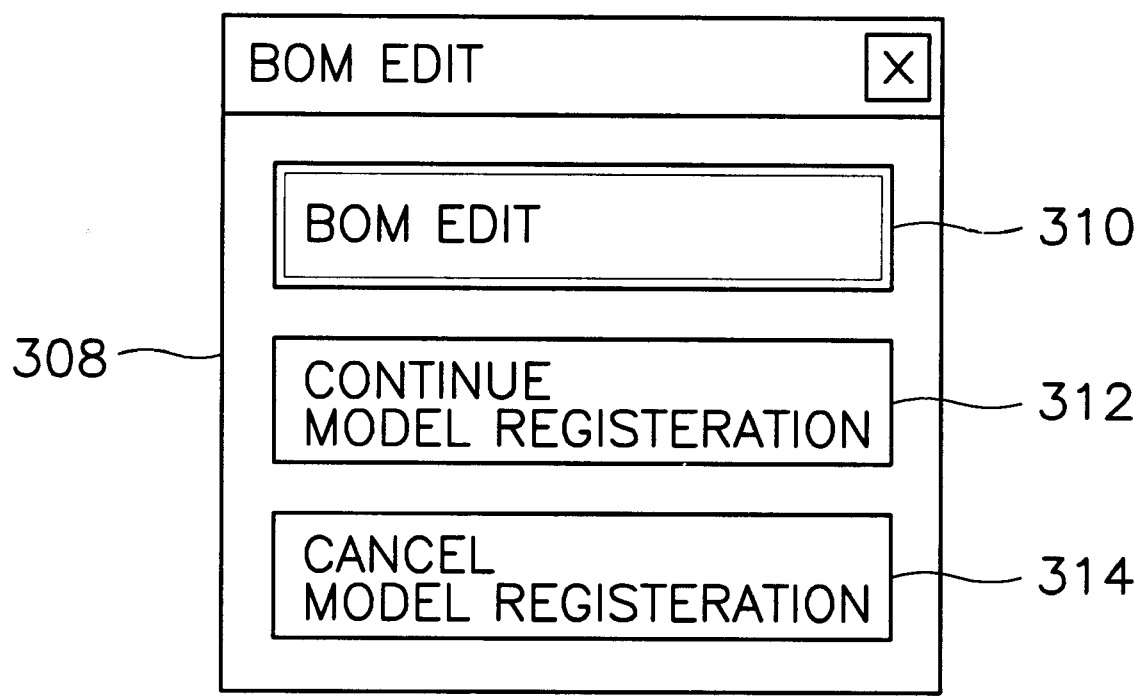

After completion of the BOM transformation operation as above, a BOM edition window 308 shown in FIG. 13 appears on the monitor screen. If the user clicks a BOM edition button 310 in BOM edit window 308, a BOM editor window 316 capable of inspecting and editing just previously transformed BOM information emerges as illustrated in FIG. 14.

In a list box 317 of BOM editor window 316, the transformed standard BOM is displayed in a table form. The column of the table consists of a material number field 318, a material registration flag field 320, a material code field 322, a material name field 324, a material specification field 326, and a process code field 328.

Following editing functions can be done with the material editor.

(1) Change of Edition View

With this function, an edition either in a material number basis or in a material code basis can be done.

(2) Material Addition

With this function, the new materials can be added. When adding new materials, a material number basis edition window 330 illustrated in FIG. 15 and a material code basis edition window 332 illustrated in FIG. 16 are presented. When the material number basis is employed, the material number, the material code, the material name, the material specification, and the process code should be inputted. When the material code basis is employed, several material numbers can be written in the material number field by using the comma or hyphen. In material code basis edition window 332, the material number can be distinguishably inputted with a notation such as "registered" or "unregistered". The "registered" notation means a material registered in the material registration operation.

(3) Material Erase

With this function, a selected material can be erased.

(4) Selection/Cancel of Material

With this function, a material or multiple materials can be selected by clicking the mouse pointer or by dragging the mouse pointer.

(5) Edition of Registered Material

With this function, a material edition window can be opened by positioning the mouse pointer on a wanted material and by double-clicking the mouse pointer. In the material edition window, editing contents and then selecting a verification button cause changes in the contents.

(6) Finding Material

With this function, a screen pointer can be moved into a position of a pre-registered material by inputting a material number of the wanted material.

(7) Flagging a Registered Material

When editing the standard BOM in the material number basis, a material whose material registration flag field has a "♦" symbol means that the material is registered. The registered materials can be modified regarding the material code and the material specification, but the material number of the registered number can not be modified or erased.

When the BOM is correctly transformed, continuation of a model registration button 312 should be selected. However, when the BOM is incorrectly transformed or cancellation of the model registration is needed, a cancellation of model registration button 314 should be selected. If the transformation of the BOM is not successful, the material supplier's environment setup menu of the model menu should be selected to modify the BOM transformation setup and to try a new registration.

As described above, the present invention enables the user to transform the original BOM interactively, which may be made by the material supplier in a different format, into the standard BOM which is suitable for the environment of an assembly line with a programmed computer system. The standardization of the BOM gives some aids to the user so as to plan and prepare effectively the insertion work and so as to manage the BOM systemically as well. Thus, errors generated in the assembly line can be reduced.

Although the preferred embodiment of the invention has been described, it is understood that the present invention should not be limited to this preferred embodiment, but various changes and modifications can be made by one skilled in the art within the spirit and scope of the invention as hereinafter claimed.

What is claimed is:

1. In a programmed computer system having a display device for preparing a working plan for inserting a plurality of materials into a printed circuit board, a method for transforming an original bill-of-material made by a material supplier into a standard bill-of-material, comprising the steps of:

storing the original bill-of-material in a first storage area of the programmed computer system;

registering field configuration information of the original bill-of-material, the field configuration information including field division way information, field expression way information, field position information, and field length information;

inputting a bill-of-material transforming command;

in response to the bill-of-material transforming command, transforming material information of the original bill-of-material stored in the first storage area into the standard bill-of-material; and storing the transformed material information in a second storage area allotted to a standard bill-of-material area.

2. The method as claimed in claim 1, further comprising the step of:

selecting a material supplier registration mode from a main menu screen displayed on the display device;

in response to the selection of the material supplier registration mode, displaying a material supplier registration window on the display device;

registering a material supplier in the material supplier registration window;

selecting a bill-of-material transformation setting button in the material supplier registration window; and in response to the selection of the bill-of-material transformation setting button, displaying a bill-of-material transformation window on the display device.

3. The method as claimed in claim 1, wherein the field division way information can be set by the steps of: displaying a first field representing that a tab key is used as a field divider and a second field representing that a space key is used as the field divider, where each of the first and second fields has a radio button, in the bill-of-material transformation window; and selecting one button between the radio buttons of the first and second fields.

4. The method as claimed in claim 1, wherein the field expression way information is used to represent on which basis the original bill-of-material is made between a material number and a material code.

5. The method as claimed in claim 1, wherein the field expression way information can be set by the steps of: displaying a third field representing that the original bill-of-material is made on a material number basis and a fourth field representing that the original bill-of-material is made on a material code basis, where each of the third and fourth fields has a radio button, in the bill-of-material transformation window; and selecting one button between the radio buttons of the third and fourth fields.

6. The method as claimed in claim 5, wherein the field configuration information further includes material number expression way information and line treatment way information, and the material number expression way information is used to represent that on which way multiple material numbers corresponding to a code is made between a consecutive expression way using a tab, space, or comma divider and a consecutive expression way using a hyphen divider in a case that the original bill-of-material is made in a basis of the material code.

7. The method as claimed in claim 6, wherein the line treatment way information is used to represent that on which way the original bill-of-material is made between a way of representing an item in multiple lines and a way of utilizing a blank line as a record divider in a case that the original bill-of-material is made in the material code basis.

8. In a programmed computer system having a display device for preparing a working plan for inserting a plurality of materials into a printed circuit board, a method for transforming an original bill-of-material made by a material supplier into a standard bill-of-material, comprising the steps of:

storing the original bill-of-material in a first storage area of the programmed computer system;

registering field configuration information of the original bill-of-material, the field configuration information including field division way information, field expression way information, field position information, and field length information;

inputting a bill-of-material transforming command;

in response to the bill-of-material transforming command, transforming material information of the original bill-of-material stored in the first storage area into the standard bill-of-material area; and storing the transformed material information in a second storage area allotted to a standard bill-of-material area;

displaying a bill-of-material editing window on the display device;

selecting an edition button from the bill-of-material editing window; and in response to the selection of the edition button, displaying an edition window for displaying the transformed standard bill-of-material.

* * * * *